(12) United States Patent
Otani et al.

(10) Patent No.: US 9,140,730 B2
(45) Date of Patent: Sep. 22, 2015

(54) SIGNAL ANALYSIS APPARATUS AND SIGNAL ANALYSIS METHOD

(71) Applicant: ANRITSU CORPORATION, Kanagawa (JP)

(72) Inventors: Toru Otani, Kanagawa (JP); Norihiro Akiyama, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 154 days.

(21) Appl. No.: 14/107,227

(22) Filed: Dec. 16, 2013

(65) Prior Publication Data

US 2014/0294199 A1   Oct. 2, 2014

(30) Foreign Application Priority Data

Mar. 28, 2013 (JP) .................................. 2013-068970

(51) Int. Cl.
*H04B 15/00* (2006.01)
*G01R 23/173* (2006.01)

(52) U.S. Cl.
CPC .................................... *G01R 23/173* (2013.01)

(58) Field of Classification Search
CPC ...... H04R 3/04; H04R 2225/43; H04R 3/005; G10L 21/0208; G10L 21/0232; H03G 9/005; H03G 9/025

USPC ..................... 381/94.3, 94.1, 94.4, 94.5, 94.7
See application file for complete search history.

(56) References Cited

U.S. PATENT DOCUMENTS 6,112,067 A * 8/2000 Seike et al. ................. 455/226.4
6,445,327 B1 * 9/2002 Kishi ............................ 341/155

FOREIGN PATENT DOCUMENTS

JP           2005003623          1/2006

* cited by examiner

*Primary Examiner* — Thjuan K Addy
(74) *Attorney, Agent, or Firm* — Pearne & Gordon LLP

(57) ABSTRACT

To provide a signal analysis apparatus and a signal analysis method which can expand a dynamic range. A spectrum analyzer 1 includes a frequency conversion unit 10 that includes an S-ATT 11 which adjusts the level of an analog input signal and converts the input signal into a predetermined intermediate frequency signal, a V-ATT 21 that adjusts the level of an output signal from the frequency conversion unit 10, an ADC 23 that converts an output signal from the V-ATT 21 into a digital signal, an f-response correction filter 24 that corrects the frequency response of an output signal from the ADC 23, and a noise floor level subtraction unit 25 that subtracts the noise level of the ADC 23 from a noise floor level indicating an overall noise level of the S-ATT 11 to the f-response correction filter 24 in a predetermined frequency band.

4 Claims, 7 Drawing Sheets

SIGNAL ANALYSIS APPARATUS AND SIGNAL ANALYSIS METHOD

TECHNICAL FIELD

The present invention relates to a signal analysis apparatus and a signal analysis method which analyze radio frequency signals used in, for example, a mobile communication system.

BACKGROUND ART

In recent years, a spectrum analyzer has been known as a measurement device that displays the distribution (spectrum) of a frequency component included in a radio frequency signal, which is a measurement target, and analyzes the measurement signal. The spectrum analyzers include a sweep type and a fast Fourier transform (FFT) type.

For example, Patent Document 1 discloses a signal analysis apparatus as the sweep spectrum analyzer. The signal analysis apparatus disclosed in Patent Document 1 includes, for example, a sweep signal generation unit, a resolution bandwidth (RBW) filter, a logarithmic converter, and a video filter.

For example, a spectrum analyzer having the structure shown in FIG. 7 has been known as the FFT spectrum analyzer. The spectrum analyzer shown in FIG. 7 includes a frequency conversion unit 110, a variable attenuator (V-ATT) 101, an analog/digital converter (ADC) 103, a frequency response (f-response) correction filter 104, a signal analysis unit 105, and a display unit 106. The frequency conversion unit 110 includes a step attenuator (S-ATT) 111, a mixer 112, a BPF 113, and an intermediate frequency (IF) amplifier 114.

In this structure, the S-ATT 111 adjusts the step of a radio frequency signal to attenuate the radio frequency signal such that the radio frequency signal is input as an analysis target to the mixer 112 at the optimal level. The gain of the V-ATT 101 is set to a predetermined value corresponding to a predetermined reference level (reference level) such that the ADC 103 does not overflow and the V-ATT 101 attenuates the input signal.

PRIOR ART DOCUMENT

Patent Document

[Patent Document 1] Japanese Unexamined Patent Application Publication No. 2005-003623

DISCLOSURE OF THE INVENTION

Problem that the Invention is to Solve

However, the spectrum analyzer according to the related art has the problem that, as the input level of the mixer 112 increases, the dynamic range is narrowed. This is caused by the following. In the spectrum analyzer according to the related art, when the input level of the mixer 112 increases, the amount of attenuation of the V-ATT 101 which adjusts the input level to the ADC 103 increases and the noise level of the ADC 103 is more dominant than the noise level of the frequency conversion unit 110 with an analog structure, which results in an increase in a noise floor level. Therefore, in the spectrum analyzer according to the related art, the noise floor level is raised by the influence of the frequency response of the f-response correction filter 104 and the dynamic range is narrowed.

The invention has been made in order to solve the problems of the related art and an object of the invention is to provide a signal analysis apparatus and a signal analysis method which can expand the dynamic range, as compared to the related art.

Means for Solving the Problem

According to a first aspect of the invention, a signal analysis apparatus (1) includes frequency conversion means (10), that includes a first attenuator (11) which adjusts a level of an analog input signal, for converting the input signal into a predetermined intermediate frequency signal, second attenuation means (21) for adjusting a level of an output signal from the frequency conversion means, analog/digital conversion means (23) for converting an output signal from the second attenuation means into a digital signal, frequency response correction means (24) for correcting a frequency response of an output signal from the analog/digital conversion means, signal analysis means (26) for analyzing an output signal from the frequency response correction means, and noise floor level subtraction means (25) that receives the output signal from the frequency response correction means, subtracts, in a predetermined frequency band, a noise level of the analog/digital conversion means from a noise floor level indicating a noise level of a signal path, which includes the frequency conversion means including the first attenuator, the second attenuation means, and the analog/digital conversion means, to the frequency response correction means, and outputs the subtracted signal to the signal analysis means.

According to this structure, in the signal analysis apparatus according to the first aspect of the invention, since the noise floor level subtraction means subtracts the noise level of the analog/digital conversion means from the noise floor level, it is possible to suppress an increase in the noise floor level caused by the noise level of the analog/digital conversion means. Therefore, the signal analysis apparatus according to the first aspect of the invention can expand the dynamic range, as compared to the related art.

According to a second aspect of the invention, in the signal analysis apparatus according to the first aspect, the noise floor level subtraction means may include a noise floor level measurement unit (25a) that measures, as a first noise floor level, a noise floor level when a gain of the second attenuation means is a first gain and measures, as a second noise floor level, a noise floor level when the gain of the second attenuation means is a second gain in the predetermined frequency band, a noise level calculation unit (25b) that calculates the noise level of the analog/digital conversion means in the predetermined frequency band on the basis of the first and second noise floor levels and the gains of the second attenuation means and the frequency response correction means, and a noise level subtraction unit (25c) that subtracts the noise level of the analog/digital conversion means from the noise floor level.

According to this structure, the signal analysis apparatus according to the second aspect of the invention suppresses an increase in the noise floor level caused by the noise level of the analog/digital conversion means. Therefore, it is possible to expand the dynamic range, as compared to the related art.

According to a third aspect of the invention, there is provided a signal analysis method for analyzing an analog input signal which is used in a signal analysis apparatus (1) including frequency conversion means (10), that includes a first attenuator (11) which adjusts a level of the analog input signal, for converting the input signal into a predetermined intermediate frequency signal, second attenuation means (21) for adjusting a level of an output signal from the frequency conversion means, analog/digital conversion means (23) for converting an output signal from the second attenuation means into a digital signal, frequency response correction means (24) for correcting a frequency response of an output signal from the analog/digital conversion means, and signal analysis means (26) for analyzing an output signal from the frequency response correction means. The signal analysis method includes a noise floor level subtraction step (S11 to S17) of receiving the output signal from the frequency response correction means, subtracting, in a predetermined frequency band, a noise level of the analog/digital conversion means from a noise floor level indicating an overall noise level of the first attenuator to the frequency response correction means, and outputting the subtracted signal to the signal analysis means.

According to this structure, in the signal analysis method according to the third aspect of the invention, since the noise level of the analog/digital conversion means is subtracted from the noise floor level in the noise floor level subtraction step, it is possible to suppress an increase in the noise floor level caused by the noise level of the analog/digital conversion means. Therefore, the signal analysis method according to the third aspect of the invention can expand the dynamic range, as compared to the related art.

According to a fourth aspect of the invention, in the signal analysis method according to the third aspect, the noise floor level subtraction step may include a noise floor level measurement step (S13, S15) of measuring, as a first noise floor level, a noise floor level when a gain of the second attenuation means is a first gain and measuring, as a second noise floor level, a noise floor level when the gain of the second attenuation means is a second gain in the predetermined frequency band, a noise level calculation step (S16) of calculating the noise level of the analog/digital conversion means in the predetermined frequency band on the basis of the first and second noise floor levels and the gains of the second attenuation means and the frequency response correction means, and a noise level subtraction step (S17) of subtracting the noise level of the analog/digital conversion means from the noise floor level.

According to this structure, the signal analysis method according to the fourth aspect of the invention suppresses an increase in the noise floor level caused by the noise level of the analog/digital conversion means. Therefore, it is possible to expand the dynamic range, as compared to the related art.

Advantage of the Invention

The invention can provide a signal analysis apparatus and a signal analysis method which can expand the dynamic range, as compared to the related art.

BEST MODE FOR CARRYING OUT THE INVENTION

Hereinafter, an embodiment of the invention will be described with reference to the drawings. An example in which a signal analysis apparatus according to the invention is applied to a spectrum analyzer will be described.

First, the structure of a spectrum analyzer according to this embodiment will be described.

Figure 1:
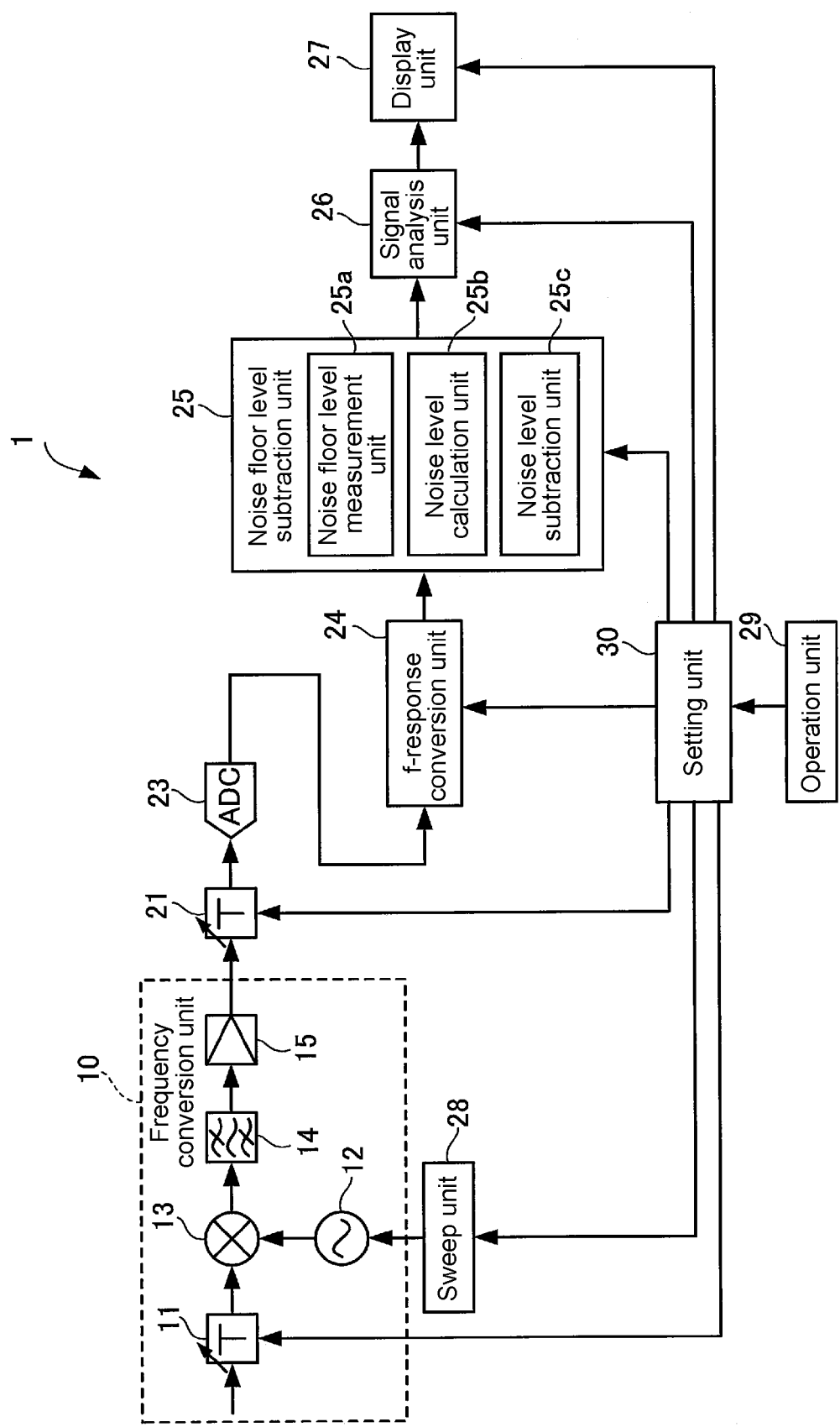
FIG. 1 is a block diagram illustrating the structure of a spectrum analyzer according to an embodiment of the invention.

As shown in FIG. 1, a spectrum analyzer 1 according to this embodiment includes a frequency conversion unit 10, a variable attenuator (V-ATT) 21, an analog/digital converter (ADC) 23, a frequency response (f-response) correction filter 24, a noise floor level subtraction unit 25, a signal analysis unit 26, a display unit 27, a sweep unit 28, an operation unit 29, and a setting unit 30. The frequency conversion unit 10 includes a step attenuator (S-ATT) 11, a local oscillation unit 12, a mixer 13, a band-pass filter (BPF) 14, and an intermediate frequency (IF) amplifier 15. The frequency conversion unit 10 forms frequency conversion means according to the invention.

The gain of the S-ATT 11 is set by the setting unit 30 such that an analog radio frequency signal, which is an analysis target, is input to the mixer 13 at the optimal level. The S-ATT 11 adjusts the step of the radio frequency signal to attenuate the radio frequency signal. In addition, the S-ATT 11 is configured such that an input element (not shown) which inputs the radio frequency signal is grounded when a noise floor level, which will be described below, is measured, under the control of the setting unit 30. The S-ATT 11 forms a first attenuator according to the invention.

The local oscillation unit 12 generates a local oscillation signal with a predetermined frequency and outputs the local oscillation signal to the mixer 13.

The mixer 13 mixes the radio frequency signal attenuated by the S-ATT 11 and the local oscillation signal from the local oscillation unit 12, converts the mixed signal into an intermediate-frequency signal, and outputs the intermediate-frequency signal to the BPF 14.

The BPF 14 filters the output signal from the mixer 13 to extract a signal in a predetermined frequency bandwidth and outputs the extracted signal to the IF amplifier 15.

The IF amplifier 15 amplifies the intermediate-frequency signal output from the BPF 14 at a predetermined gain and outputs the amplified signal to the V-ATT 21.

The gain of the V-ATT 21 is set by the setting unit 30 such that the ADC 23 does not overflow and the V-ATT 21 attenuates an input signal. For example, the gain of the V-ATT 21 is determined by a reference level which is set by the operation of the operation unit 29 by the tester. Data for the correction value of the gain of the V-ATT 21 with respect to the frequency is stored in a memory (not shown) of the setting unit 30. The V-ATT 21 forms second attenuation means according to the invention.

The ADC 23 samples the analog signal input from the V-ATT 21, quantizes the sampled analog signal, converts the quantized analog signal into digital data, and outputs the digital data to the f-response correction filter 24. The ADC 23 forms analog/digital conversion means according to the invention.

The f-response correction filter 24 is, for example, a finite impulse response (FIR) filter. The f-response correction filter 24 has a filter coefficient which is determined on the basis of a predetermined gain correction value for planarizing the frequency response of the level of the signal output from the ADC 23. Data for the gain correction value is stored in the memory (not shown) of the setting unit 30. The f-response correction filter 24 forms frequency response correction means according to the invention.

The noise floor level subtraction unit 25 includes a noise floor level measurement unit 25a, a noise level calculation unit 25b, and a noise level subtraction unit 25c and subtracts the noise level of the ADC 23 from a noise floor level indicating the overall noise level of the frequency conversion unit 10 and the units from the V-ATT 21 to the f-response correction filter 24. According to the test result, the noise floor level of the frequency conversion unit 10 and the units from the V-ATT 21 to the f-response correction filter 24 is considered to be equal to the noise floor level of the spectrum analyzer 1. Therefore, the noise floor level subtraction unit 25 subtracts the noise level of the ADC 23 from the noise floor level of the spectrum analyzer 1. The noise floor level subtraction unit 25 forms noise floor level subtraction means according to the invention.

The noise floor level measurement unit 25a measures the noise floor level of the spectrum analyzer 1 as a first noise floor level when the gain of the V-ATT 21 is a first gain and measures the noise floor level of the spectrum analyzer 1 as a second noise floor level when the gain of the V-ATT 21 is a second gain, at a predetermined frequency.

The noise level calculation unit 25b calculates the noise level of the ADC 23 at a predetermined frequency on the basis of the first and second noise floor levels measured by the noise floor level measurement unit 25a and the gains of the V-ATT 21 and the f-response correction filter 24.

The noise level subtraction unit 25c subtracts the noise level of the ADC 23 from the first and second noise floor levels.

When analyzing a radio frequency signal, which is an analysis target, the signal analysis unit 26 performs Fourier transform analysis (FFT analysis) for the signal input from the noise floor level subtraction unit 25, generates an analysis result signal indicating the analysis result, and outputs the analysis result signal to the display unit 27, on the basis of a control signal from the setting unit 30.

The display unit 27 displays data for the analysis result obtained by the signal analysis unit 26 on a screen, on the basis of a control signal from the setting unit 30.

The sweep unit 28 sweeps the local oscillation signal output from the local oscillation unit 12 with a predetermined frequency sweep width on the basis of a control signal from the setting unit 30.

The operation unit 29 is operated by the tester and includes, for example, an input device, such as a display which displays a setting screen for setting test conditions including a frequency band to be observed and a reference level or for settings related to the operation of a cursor, a keyboard, a dial, or a mouse, and a control circuit which controls the input device.

The setting unit 30 generates control signals for setting the test conditions which are input by the tester through the operation unit 29 to each unit and outputs the control signals. The setting unit 30 is a microcomputer including, for example, a central processing unit (CPU) (not shown), a read only memory (ROM) which stores programs, a random access memory (RAM), and an input/output circuit to which various interfaces are connected.

Figure 2:
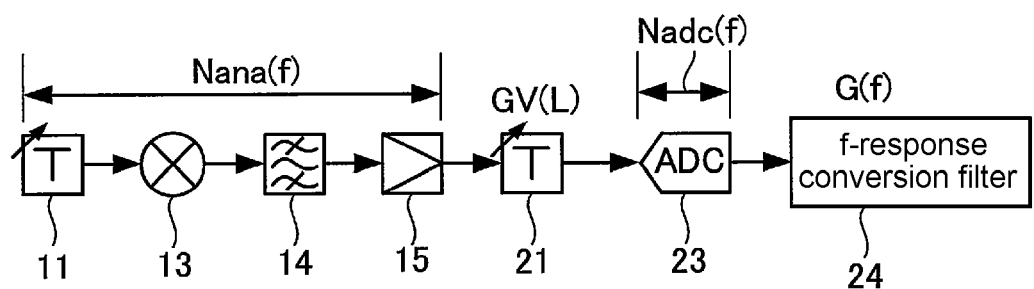
FIG. 2 is a block diagram illustrating a signal path from an S-ATT to an f-response correction filter in the embodiment of the invention.

Next, a noise level calculation expression of the spectrum analyzer 1 will be described with reference to FIG. 2. FIG. 2 is a block diagram illustrating a signal path from the S-ATT 11 to the f-response correction filter 24 in the structure shown in FIG. 1.

In FIG. 2, Nana(f) indicates the noise level from the S-ATT 11 to the IF amplifier 15, that is, the noise level of an analog stage. GV(L) indicates the gain of the V-ATT 21 and is a function of the signal level. Nadc(f) indicates the noise level of the ADC 23. G(f) indicates the gain of the f-response correction filter 24 and is a function of the frequency.

Next, the frequency response of Nana(f) and Nadc(f) will be described. First, Nana(f) includes the frequency response (f_RF) of the radio frequency (RF) from the S-ATT 11 to the mixer 13 and the frequency response (f_BW) in the intermediate frequency (IF) ((IF) response) from the BPF 14 to the IF amplifier 15. Therefore, more exactly, Nana(f) is referred to as Nana(f_RF, f_BW) and is represented by a two-dimensional function. However, when the noise level of the ADC 23 is calculated, the radio frequency may be discussed only at an arbitrary point. Therefore, Nana(f_RF, f_BW)=Nana(f) (where f indicates frequency responces in a band) may be defined.

Since Nadc(f) indicates the noise level after the mixer 13 converts the frequency into the intermediate frequency, it does not have the frequency response of the radio frequency, but has only the frequency response in the intermediate frequency response. That is, Nadc(f) has the frequency response which are not related to the setting of the radio frequency.

When each variable is defined as described above, the frequency response Nsa(f) of the noise floor level of the spectrum analyzer 1 can be represented by [Equation 1].

$$Nsa(f)=(Nana(f) \times GV(L)+Nadc(f)) \times G(f) \quad \text{[Equation 1]}$$

In this equation, GV(L) and G(f) can be calculated by correction values which are acquired in advance. In addition, the setting unit 30 can change the reference level to set GV(L) which is the gain of the V-ATT 21. Therefore, it is possible to calculate Nana(f) and Nadc(f) on the basis of [Equation 1] by changing GV(L) to measure two types of Nsa(f).

Next, association with the noise floor level subtraction unit 25 will be described. The noise floor level subtraction unit 25 is operated as follows at a predetermined frequency on the basis of the control signal from the setting unit 30. That is, the noise floor level measurement unit 25a changes the gain GV(L) of the V-ATT 21 to measure two types of Nsa(f). The noise level calculation unit 25b calculates Nana(f) and Nadc(f) on the basis of [Equation 1] and two types of Nsa(f). The noise level subtraction unit 25c subtracts Nadc(f) from the noise floor level. According to this structure, the noise floor level subtraction unit 25 can exclude the influence of Nadc(f) from the frequency response Nsa(f) of the noise floor level of the spectrum analyzer 1.

Next, the derivation of the theoretical equation of Nadc(f) will be described.

(1) The frequency response of the noise floor level of the spectrum analyzer 1 when the reference level is 0 dBm and the set value of the gain of the S-ATT 11 is 10 dB is represented by N0(f). In this case, the input level of the mixer 13 is −10 dBm.

(2) The frequency response of the noise floor level of the spectrum analyzer 1 when the reference level is 10 dBm and the set value of the gain of the S-ATT 11 is 10 dB is represented by N10(f). In this case, the input level of the mixer 13 is 0 dBm.

The frequency response N0(f) and N10(f) of the noise level of the spectrum analyzer 1 can be represented by [Equation 2] and [Equation 3], respectively.

$$N0(f)=(Nana(f)+Nadc(f))\times G(f) \quad \text{[Equation 2]}$$

$$N10(f)=(Nana(f)\times \Delta GV+Nadc(f))\times G(f) \quad \text{[Equation 3]}$$

In the above-mentioned equation, $\Delta GV$ indicates a gain difference between the set values of the gain of the V-ATT 21 when data of N0(f) and N10(f) are acquired. When the set value of the gain of the V-ATT 21 during the acquisition of data of N0(f) is represented by $Vatt_{N0}$ and the set value of the gain of the V-ATT 21 during the acquisition of data of N10(f) is represented by $Vatt_{N10}$, $\Delta GV$ is represented by [Equation 4].

$$\Delta GV=GV(Vatt_{N10})/GV(Vatt_{N0}) \quad \text{[Equation 4]}$$

In practice, since Nana(f) and Nadc(f) are considered to be constant regardless of the set value of the gain of the V-ATT 21, Nadc(f) can be calculated by the above-mentioned [Equation 2] and [Equation 3].

First, [Equation 5] and [Equation 6] are defined.

$$N0(f)'=N0(f)/G(f) \quad \text{[Equation 5]}$$

$$N10(f)'=N10(f)/G(f) \quad \text{[Equation 6]}$$

Then, [Equation 7] is obtained from [Equation 2] and [Equation 5].

$$Nana(f)=N0(f)'-Nadc(f) \quad \text{[Equation 7]}$$

Then, [Equation 8] is obtained from [Equation 6] and [Equation 7].

$$N10(f)'=(1-\Delta GV)\times Nadc(f)+\Delta GV\times N0(f)' \quad \text{[Equation 8]}$$

Since [Equation 9] is obtained from [Equation 8], it is possible to calculate the noise level Nadc(f) of the ADC 23.

$$Nadc(f)=(N10(f)'-\Delta GV\times N0(f)')/(1-\Delta GV) \quad \text{[Equation 9]}$$

Figure 3:
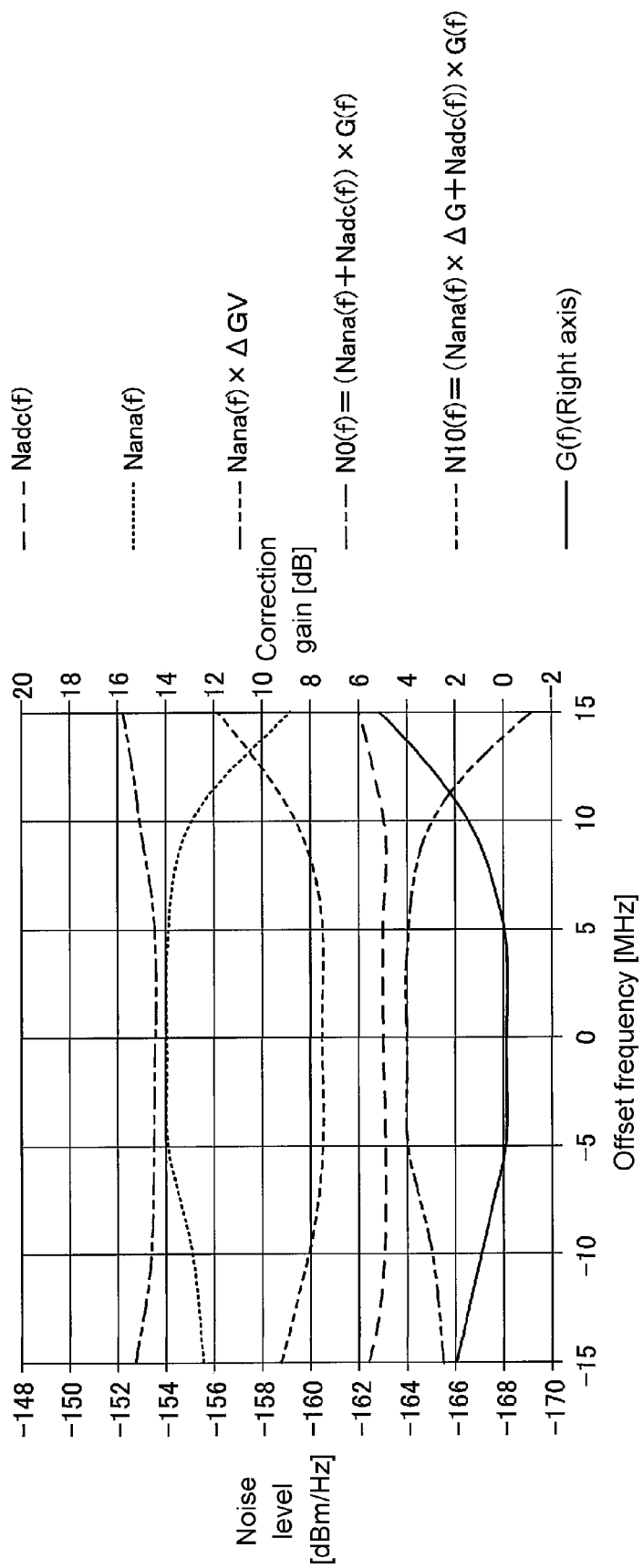
FIG. 3 is a diagram illustrating the noise level of each element with respect to an offset frequency in the embodiment of the invention.

Next, the principle of raising the noise floor level which has been described in "Problem that the Invention is to Solve" will be described with reference to FIG. 3. FIG. 3 shows the noise level (left axis) of each element with respect to an offset frequency. However, the right axis indicates the correction gain G(f) of the f-response correction filter 24 with respect to the offset frequency.

First, when the reference level is 0 dBm and the set value of the gain of the S-ATT 11 is 10 dB (N0(f)), the noise level (Nadc(f)) of the ADC 23 is sufficiently less than the noise level (Nana(f)) of the analog stage. Therefore, the noise floor level Nsa(f) of the spectrum analyzer 1 is substantially equal to the value obtained by multiplying Nana(f) by G(f). In this case, since there is a correlation between Nana(f) and G(f) (the frequency response of the noise floor level of the analog stage are substantially identical to the frequency response of G(f)), they are offset a little and the frequency response of G(f) do not appear as is.

When the reference level is 10 dBm and the set value of the gain of the S-ATT 11 is 10 dB (N10(f)), Nana(f) is attenuated by the gain GV(L) of the V-ATT 21 and the level of Nana(f) is lower than that of Nadc(f). As shown in FIG. 3, in general, Nadc(f) is substantially flat and is not correlated with G(f). As a result, almost all of the frequency response of G(f) appear in the frequency response Nsa(f) of the noise floor level of the spectrum analyzer 1 as they are.

Figure 4:
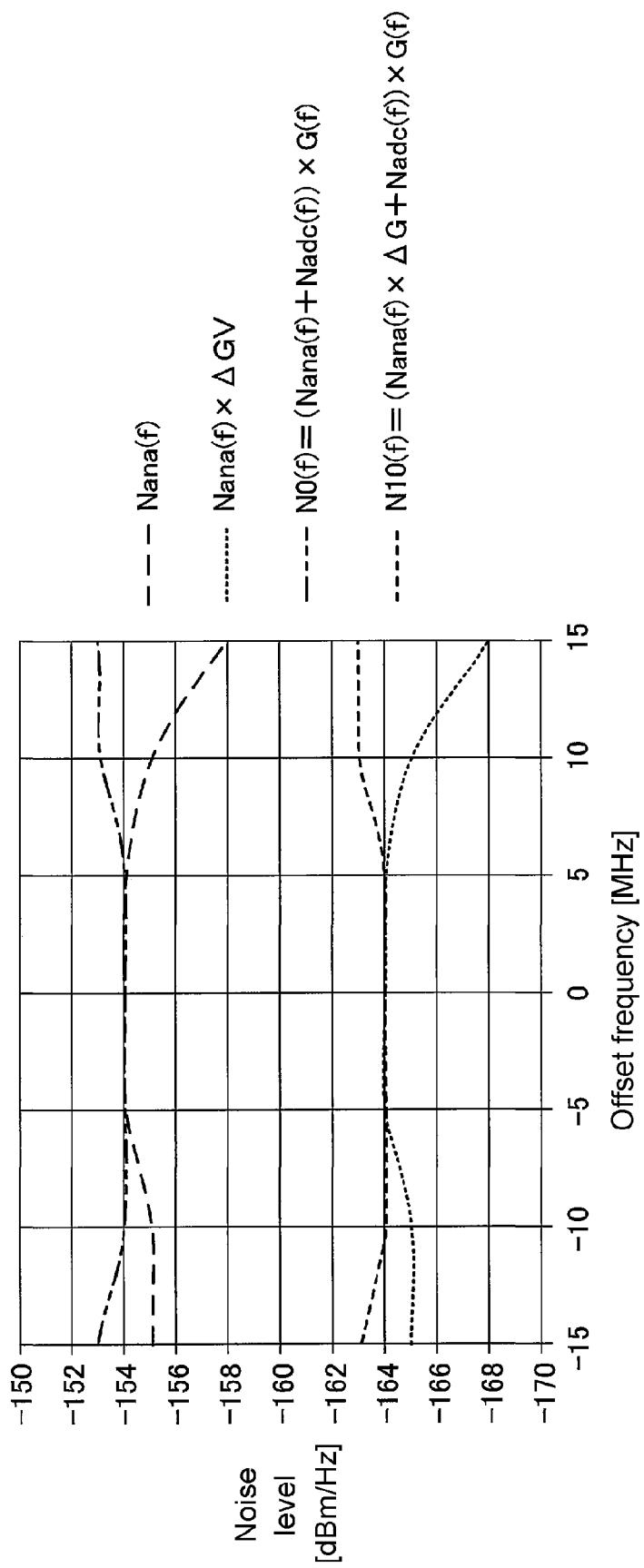
FIG. 4 is a diagram illustrating frequency response when Nadc(f) is subtracted from a noise floor level in the embodiment of the invention.

FIG. 4 shows the frequency response when Nadc(f) is subtracted from the noise floor level on the basis of the actual measurement result. When Nadc(f) can be completely subtracted, there is no influence of Nadc(f) even though the frequency response are N10(f) and the frequency response of the noise floor level can be the same as those in the case of N0(f). In addition, even when the reference level is raised, there is no influence of Nadc(f). Therefore, it is possible to constantly maintain the noise floor level, regardless of the reference level.

Here, N0(f) and N10(f) are compared with each other with reference to FIGS. 3 and 4. First, in FIG. 3, for example, at an offset frequency of ±5 MHz, the difference between N0(f) and N10(f) is about 7 dB even though the difference between the input levels to the mixer 13 is 10 dB. This is because the noise level Nadc(f) of the ADC 23 is more dominant than the noise level of the frequency conversion unit 10 with an analog structure.

In contrast, in FIG. 4, at an offset frequency of ±5 MHz, the difference between N0(f) and N10(f) is 10 dB which is equal to the difference between the input levels to the mixer 13. This result shows that, even when the reference level is raised, the noise floor level of the spectrum analyzer 1 is not affected by Nadc(f).

In FIG. 4, the noise floor level in the case of N10(f) is 10 dB less than that in the case of N0(f). However, in practice, since the reference level increases depending on the gain of the V-ATT 21 (the display level of the display unit 27 with respect to the full scale level of the ADC 23 is changed), the display levels of N10(f) and N0(f) are equal to each other.

(Experiment Result)

Next, the result of an experiment for confirming the effect when Nadc(f) is subtracted from the noise floor level will be described with reference to FIG. 5. In the experiment, measurement was performed in a resolution bandwidth (RBW) of 1 MHz and the result was converted into a value in an RBW of 1 Hz.

Figure 5:
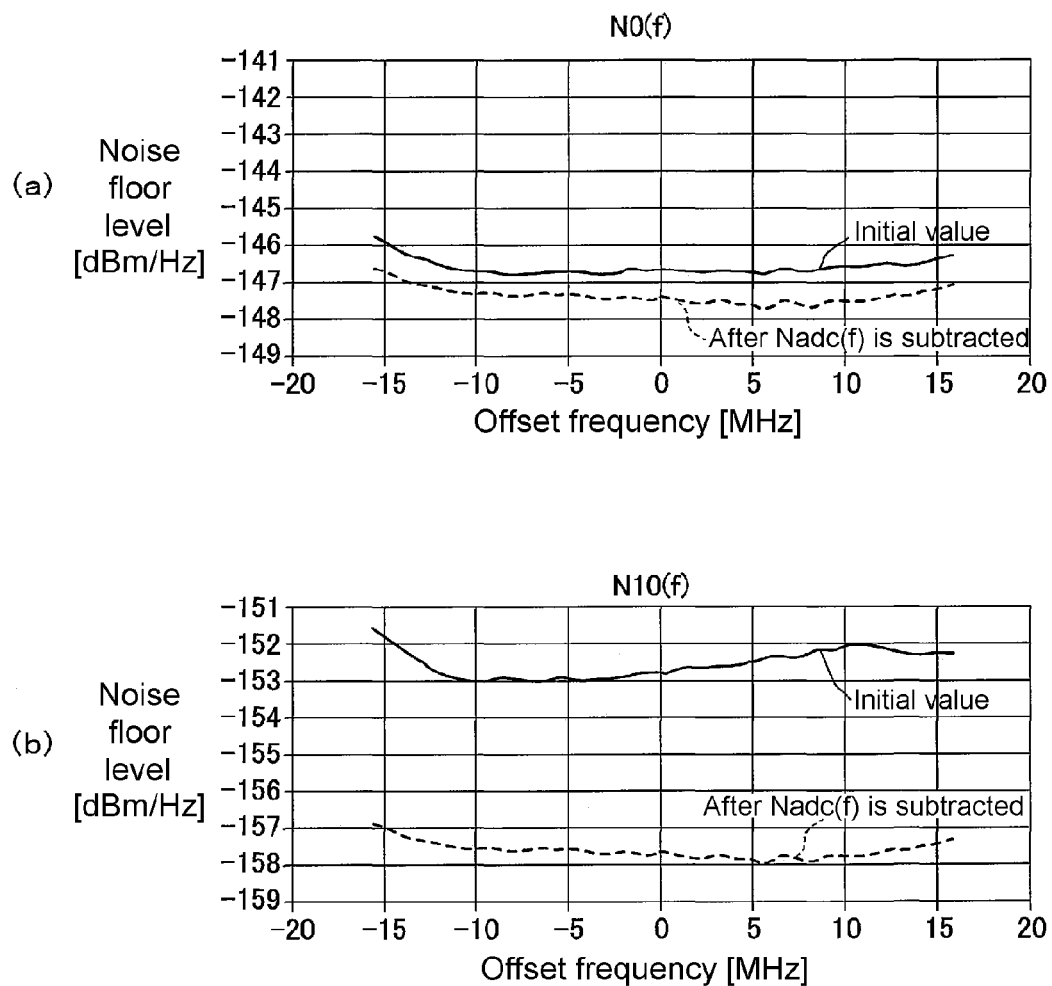
FIG. 5 is a diagram illustrating the frequency response of the noise floor level in the case of N0(f) and N10(f) in the embodiment of the invention.

FIG. 5(*a*) shows the frequency response of the noise floor level at an offset frequency of ±15 MHz in the case of N0(f) (the input level of the mixer 13 is −10 dBm). In FIG. 5(*a*), a solid line indicates the frequency response of an initial noise floor level and a dashed line indicates the frequency response of the noise floor level after Nadc(f) is subtracted from the initial value. In the frequency band shown in FIG. 5(*a*), the initial value and a variation in the noise floor level after Nadc(f) is subtracted are about 1 dB. However, since Nadc(f) is subtracted, the noise floor level is about 0.5 dB to 1 dB less than the initial value. Therefore, in the case of N0(f), the dynamic range is improved by about 0.5 dB to 1 dB.

FIG. 5(*b*) shows the frequency response of the noise floor level at an offset frequency of ±15 MHz in the case of N10(f) (the input level of the mixer 13 is 0 dBm). In FIG. 5(*b*), a solid line indicates the frequency response of the initial noise floor level and a dashed line indicates the frequency response of the noise floor level after Nadc(f) is subtracted from the initial value. In the frequency band shown in FIG. 5(*b*), the noise floor level of the initial value varies in the range of about 1.5 dB. However, the noise floor level after Nadc(f) is subtracted varies in the range of about 1 dB. Therefore, the frequency response of the noise floor level are planarized by the subtraction of Nadc(f). In the case of N10(f), when Nadc(f) is subtracted, the noise floor level is about 4.5 dB to 5.8 dB less than the initial value. Therefore, in the case of N10(f), the dynamic range is expanded by about 4.5 dB to 5.8 dB, in addition to the reduction in the variation of the noise floor level.

Since the reference level increases depending on the gain of the V-ATT 21 (the display level of the display unit 27 with respect to the full scale level of the ADC 23 is changed), the noise floor level shown in FIG. 5(b) is increased by 10 dB.

Figure 6:
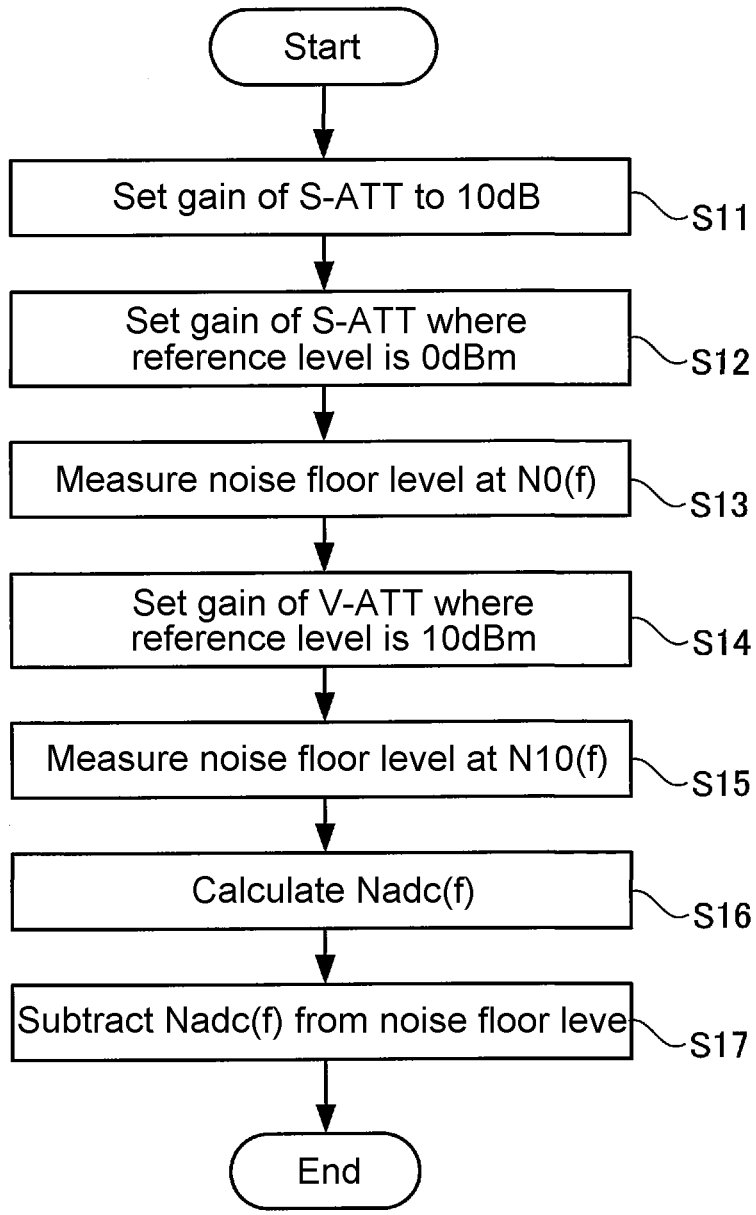
FIG. 6 is a flowchart illustrating the operation of a noise floor level subtraction unit in the embodiment of the invention.
Figure 7:
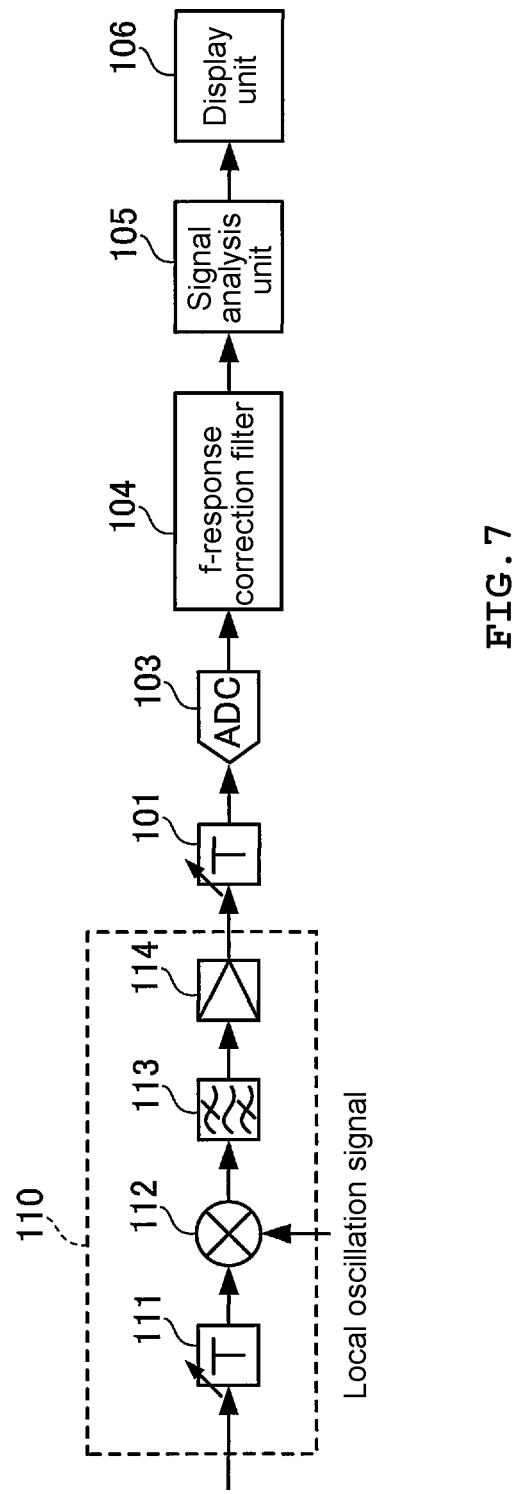
FIG. 7 is a block diagram illustrating the structure of a spectrum analyzer according to the related art.

Next, the operation of the noise floor level subtraction unit 25 in the spectrum analyzer 1 will be described with reference to FIG. 6. An example will be described in which the noise floor level subtraction unit 25 smoothes the frequency response of the noise floor level using N0(f), which is the noise level of the spectrum analyzer 1 when the reference level is 0 dBm and the set value of the gain of the S-ATT 11 is 10 dB, and N10(f), which is the noise level of the spectrum analyzer 1 when the reference level is 10 dBm and the set value of the gain of the S-ATT 11 is 10 dB.

The setting unit 30 connects the input terminal of the S-ATT 11 to the ground and sets the gain of the S-ATT 11 to 10 dB (step S11).

The setting unit 30 sets the gain (first gain) of the V-ATT 21 at which the reference level is 0 dBm to the V-ATT 21 (step S12).

The noise floor level measurement unit 25a measures the output level of the f-response correction filter 24 to measure the noise floor level (first noise floor level) in the case of N0(f) (step S13).

The setting unit 30 set the gain (second gain) of the V-ATT 21 at which the reference level is 10 dBm to the V-ATT 21 (step S14).

The noise floor level measurement unit 25a measures the output level of the f-response correction filter 24 to measure the noise floor level (second noise floor level) of N10(f) (step S15).

The noise level calculation unit 25b receives the correction value data of the gains of GV(L) and G(f) from the setting unit 30 and calculates Nadc(f) from the correction value data and data for N0(f) and N10(f) on the basis of [Equation 1] (step S16).

The noise level subtraction unit 25c subtracts Nadc(f) from the noise floor levels N0(f) and N10(f) when a measurement signal is measured (step S17). As a result, in the case of N0(f) and N10(f), the influence of Nadc(f) is excluded from the frequency response of the noise floor level of the spectrum analyzer 1.

As described above, in the spectrum analyzer 1 according to this embodiment, the noise floor level subtraction unit 25 subtracts the noise level of the ADC 23 from the noise floor level. Therefore, it is possible to suppress an increase in the noise floor level caused by the noise level of the ADC 23. Therefore, the spectrum analyzer 1 according to this embodiment can expand the dynamic range, as compared to the related art.

In the above-described embodiment, the reference level is 0 dBm and 10 dBm (the input level of the mixer 13 is −10 dBm and 0 dBm). However, the invention is not limited thereto. For example, the reference level may be 1 dBm, 2 dBm, and 11 dBm and the noise level of the ADC 23 may be calculated and subtracted.

In the above-described embodiment, the signal analysis apparatus according to the invention is applied to an FFT spectrum analyzer. However, the invention is not limited thereto. For example, the invention may be applied to a signal analysis apparatus, such as a signal analyzer in which an ADC is provided in the rear stage of an analog circuit, or a general sweep spectrum analyzer. In this case, the same effect as described above is obtained.

INDUSTRIAL APPLICABILITY

As described above, the signal analysis apparatus and the signal analysis method according to the invention have the effect of expanding the dynamic range, as compared to the related art, and are useful as a signal analysis apparatus and a signal analysis method which analyze radio frequency signals used in a mobile communication system.

DESCRIPTION OF REFERENCE NUMERALS AND SIGNS

1: SPECTRUM ANALYZER (SIGNAL ANALYSIS APPARATUS)
10: FREQUENCY CONVERSION UNIT (FREQUENCY CONVERSION MEANS)
11: S-ATT (FIRST ATTENUATOR)
12: LOCAL OSCILLATION UNIT
13: MIXER
14: BPF
15: IF AMPLIFIER
21: V-ATT (SECOND ATTENUATION MEANS)
22: BPF
23: ADC (ANALOG/DIGITAL CONVERSION MEANS)
24: f-RESPONSE CORRECTION FILTER (FREQUENCY RESPONSE CORRECTION MEANS)
25: NOISE FLOOR LEVEL SUBTRACTION UNIT (NOISE FLOOR LEVEL SUBTRACTION MEANS)
25a: NOISE FLOOR LEVEL MEASUREMENT UNIT
25b: NOISE LEVEL CALCULATION UNIT
25c: NOISE LEVEL SUBTRACTION UNIT
26: SIGNAL ANALYSIS UNIT
27: DISPLAY UNIT
28: SWEEP UNIT
29: OPERATION UNIT
30: SETTING UNIT

What is claimed is:

1. A signal analysis apparatus comprising:
   frequency conversion means, that includes a first attenuator which adjusts a level of an analog input signal, for converting the input signal into a predetermined intermediate frequency signal;
   second attenuation means for adjusting a level of an output signal from the frequency conversion means;
   analog/digital conversion means for converting an output signal from the second attenuation means into a digital signal;
   frequency response correction means for correcting a frequency response of an output signal from the analog/digital conversion means;
   signal analysis means for analyzing an output signal from the frequency response correction means; and
   noise floor level subtraction means that receives the output signal from the frequency response correction means, subtracts, in a predetermined frequency band, a noise level of the analog/digital conversion means from a noise floor level indicating a noise level of a signal path, which includes the frequency conversion means, the second attenuation means, and the analog/digital conversion means, to the frequency response correction means, and outputs the subtracted signal to the signal analysis means.

2. The signal analysis apparatus according to claim 1, wherein the noise floor level subtraction means includes:
   a noise floor level measurement unit that measures, as a first noise floor level, a noise floor level when a gain of the second attenuation means is a first gain and measures, as a second noise floor level, a noise floor level when the gain of the second attenuation means is a second gain in the predetermined frequency band;

a noise level calculation unit that calculates the noise level of the analog/digital conversion means in the predetermined frequency band on the basis of the first and second noise floor levels and the gains of the second attenuation means and the frequency response correction means; and a noise level subtraction unit that subtracts the noise level of the analog/digital conversion means from the noise floor level.

3. A signal analysis method for analyzing an analog input signal which is used in a signal analysis apparatus including frequency conversion means, that includes a first attenuator which adjusts a level of the analog input signal, for converting the input signal into a predetermined intermediate frequency signal, second attenuation means for adjusting a level of an output signal from the frequency conversion means, analog/digital conversion means for converting an output signal from the second attenuation means into a digital signal, frequency response correction means for correcting a frequency response of an output signal from the analog/digital conversion means, and signal analysis means for analyzing an output signal from the frequency response correction means, the signal analysis method comprising:

a noise floor level subtraction step of receiving the output signal from the frequency response correction means, subtracting, in a predetermined frequency band, a noise level of the analog/digital conversion means from a noise floor level indicating an overall noise level of the first attenuator to the frequency response correction means, and outputting the subtracted signal to the signal analysis means.

4. The signal analysis method according to claim 3, wherein the noise floor level subtraction step includes:

a noise floor level measurement step of measuring, as a first noise floor level, a noise floor level when a gain of the second attenuation means is a first gain and measuring, as a second noise floor level, a noise floor level when the gain of the second attenuation means is a second gain in the predetermined frequency band;

a noise level calculation step of calculating the noise level of the analog/digital conversion means in the predetermined frequency band on the basis of the first and second noise floor levels and the gains of the second attenuation means and the frequency response correction means; and a noise level subtraction step of subtracting the noise level of the analog/digital conversion means from the noise floor level.

\* \* \* \* \*